United States Patent

Dorri et al.

Patent Number: 5,574,417
Date of Patent: Nov. 12, 1996

[54] OPEN MRI MAGNET WITH HOMOGENEOUS IMAGING VOLUME

[75] Inventors: Bizhan Dorri, Clifton Park; Evangelos T. Laskaris, Schenectady, both of N.Y.

[73] Assignee: General Electric Company, Schenectady, N.Y.

[21] Appl. No.: 547,002

[22] Filed: Oct. 23, 1995

[51] Int. Cl.⁶ .............................. H01F 7/22; G01V 3/00
[52] U.S. Cl. ........................ 335/216; 335/301; 324/319; 324/320
[58] Field of Search ........................ 335/216, 296, 335/299, 300, 301; 324/318, 319, 320; 128/653.2, 653.5

[56] References Cited

U.S. PATENT DOCUMENTS

| | | | |
|---|---|---|---|
| 4,698,611 | 10/1987 | Vermilyea | 335/298 |
| 4,710,741 | 12/1987 | McGinley | 335/296 |
| 4,924,198 | 5/1990 | Laskaris | 335/216 |
| 5,291,169 | 3/1994 | Ige et al. | 335/216 |
| 5,343,183 | 8/1994 | Shimada et al. | 335/301 |
| 5,389,909 | 2/1995 | Havens | 335/216 |
| 5,410,287 | 4/1995 | Laskaris et al. | 335/216 |
| 5,463,364 | 10/1995 | Muller | 335/299 |

OTHER PUBLICATIONS

Pending U.S. patent application Ser. No. 373,995, Filed Oct. 17, 1995, by B. Dorri, "Method for Passively Shimming an Open Magnet".

Pending U.S. patent application Ser. No. 373,996, Filed Oct. 17, 1995, by B. Dorri, "Method for Passively Shimming A Magnet".

Pending U.S. patent application Ser. No. 08/509,565, Filed Jul. 31, 1995, by T. Havens et al., "Open Architecture Magnetic Resonance Imaging Superconducting Magnet Assembly".

Primary Examiner—Brian W. Brown
Assistant Examiner—Raymond M. Barrera
Attorney, Agent, or Firm—Douglas E. Erickson; Marvin Snyder

[57] ABSTRACT

An open magnetic resonance imaging (MRI) magnet having first and second spaced-apart superconductive coil assemblies each including a toroidal-shaped coil housing containing a superconductive main coil. A generally annular-shaped permanent magnet array is associated with each coil assembly, being generally coaxially aligned with the associated coil assembly and being spaced radially inward and radially apart from the associated coil assembly's superconductive main coil. The permanent magnet arrays overcome the gross magnetic field distortions in the imaging volume of the superconductive main coils (created by the open space between the magnet's superconductive coil assemblies) to produce a magnetic field of high uniformity within the imaging volume.

8 Claims, 4 Drawing Sheets

OPEN MRI MAGNET WITH HOMOGENEOUS IMAGING VOLUME

BACKGROUND OF THE INVENTION

The present invention relates generally to a superconductive magnet (such as, but not limited to, a helium-cooled and/or cryocooler-cooled superconductive magnet) used to generate a high magnetic field as part of a magnetic resonance imaging (MRI) system, and more particularly to such a magnet having an open design and having a homogeneous (i.e., uniform) magnetic field within its imaging volume.

MRI systems employing superconductive or other type magnets are used in various fields such as medical diagnostics. Known superconductive magnets include liquid-helium cooled and cryocooler-cooled superconductive magnets. Typically, for a helium-cooled magnet, the superconductive coil assembly includes a superconductive main coil which is at least partially immersed in liquid helium contained in a helium dewar which is surrounded by a dual thermal shield which is surrounded by a vacuum enclosure. In a conventional cryocooler-cooled magnet, the superconductive main coil is surrounded by a thermal shield which is surrounded by a vacuum enclosure, and the cryocooler coldhead is externally mounted to the vacuum enclosure with the coldhead's first stage in thermal contact with the thermal shield and with the coldhead's second stage in thermal contact with the superconductive main coil. Nb-Ti superconductive coils typically operate at a temperature of generally 4 Kelvin, and Nb-Sn superconductive coils typically operate at a temperature of generally 10 Kelvin.

Known superconductive magnet designs include closed magnets and open magnets. Closed magnets typically have a single, tubular-shaped superconductive coil assembly having a bore. The superconductive coil assembly includes several radially-aligned and longitudinally spaced-apart superconductive main coils each carrying a large, identical electric current in the same direction. The superconductive main coils are thus designed to create a magnetic field of high uniformity within a spherical imaging volume centered within the magnet's bore where the object to be imaged is placed. Although the magnet is so designed to have a highly uniform magnetic field within the imaging volume, manufacturing tolerances in the magnet and magnetic field disturbances caused by the environment at the field site of the magnet usually require that the magnet be corrected at the field site for such minor irregularities in the magnetic field. Typically, the magnet is shimmed at the field site by using pieces of iron, or, for Nb-Ti superconductive magnets cooled by liquid helium, by using numerous Nb-Ti superconductive correction coils. The correction coils are placed within the superconductive coil assembly radially near and radially inward of the main coils. Each correction coil carries a different, but low, electric current in any required direction including a direction opposite to the direction of the electric current carried in the main coils.

Open magnets typically employ two spaced-apart superconductive coil assemblies with the space between the assemblies allowing for access by medical personnel for surgery or other medical procedures during MRI imaging. The patient may be positioned in that space or also in the bore of the toroidal-shaped coil assemblies. The open space helps the patient overcome any feelings of claustrophobia that may be experienced in a closed magnet design. The literature is largely silent on how superconductive open magnets can be made to have a magnetic field of high uniformity within the imaging volume when the creation of the open space between the superconductive coil assemblies grossly distorts the magnetic field creating a magnetic field of low uniformity within the imaging volume. Such magnetic field distortion is well beyond that which can be overcome by using known magnet shimming technology.

What is needed is an open MRI magnet designed to have a highly uniform magnetic field within its imaging volume despite the gross magnetic field distortions created by the open space between the magnet's superconductive coil assemblies.

SUMMARY OF THE INVENTION

It is an object of the invention to provide an open superconductive MRI magnet designed to have a homogeneous magnetic field within its imaging volume.

The open MRI magnet of the invention includes a first superconductive coil assembly including a generally toroidal-shaped first coil housing and a generally annular-shaped first superconductive main coil. The first coil housing surrounds a first bore and has a generally longitudinal first axis. The first main coil is generally coaxially aligned with the first axis, disposed within the first coil housing, and has a first magnetic field direction within the first bore generally parallel to the first axis. The open MRI magnet also includes a generally annular-shaped first permanent magnet array generally coaxially aligned with the first axis and spaced radially inward and radially apart from the first superconductive main coil. The open MRI magnet additionally includes a second superconductive coil assembly including a generally toroidal-shaped second coil housing and a generally annular-shaped second superconductive main coil. The second coil housing is longitudinally spaced apart from the first coil housing, surrounds a second bore, and has a generally longitudinal second axis which is generally coaxially aligned with the first axis. The second main coil is generally coaxially aligned with the second axis, disposed within the second coil housing, and has a second magnetic field direction within the second bore generally identical to the first magnetic field direction. The open MRI magnet further includes a generally annular-shaped second permanent magnet array generally coaxially aligned with the second axis and spaced radially inward and radially apart from the second superconductive main coil. In a preferred embodiment, the second superconductive coil assembly is a generally mirror image of the first superconductive coil assembly, and the second permanent magnet array is a generally mirror image of the first permanent magnet array.

Several benefits and advantages are derived from the invention. With Applicant's open MRI magnet design, the permanent magnet arrays may be chosen by magnetic field analysis to overcome the gross magnetic field distortions within the imaging volume of the main coils (created by the open space between the magnet's superconductive coil assemblies) to produce a magnetic field of high uniformity within the imaging volume. Applicant's highly uniform magnetic field permits high quality MRI imaging. Applicant's open magnet design overcomes any claustrophobia feelings of patients. Applicant's design of an open magnet with a highly uniform magnetic field gives access to the patient by medical personnel for surgery or other medical procedures during high-quality MRI imaging.

BRIEF DESCRIPTION OF THE DRAWINGS

The accompanying drawings illustrate two preferred embodiments of the present invention wherein.

DETAILED DESCRIPTION OF THE INVENTION

Figure 1:
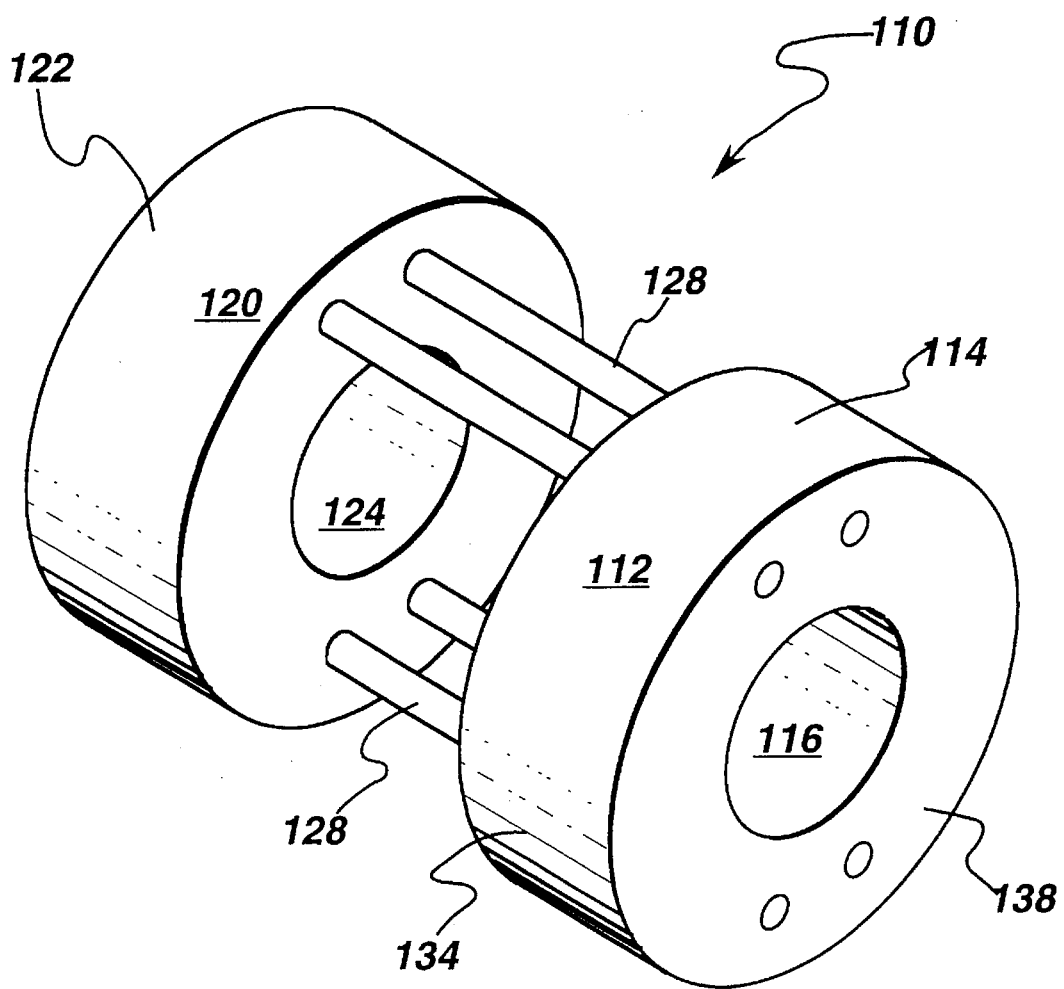
FIG. 1 is a perspective view of a first preferred embodiment of the open MRI magnet of the invention having internal permanent magnet arrays.
Figure 2:
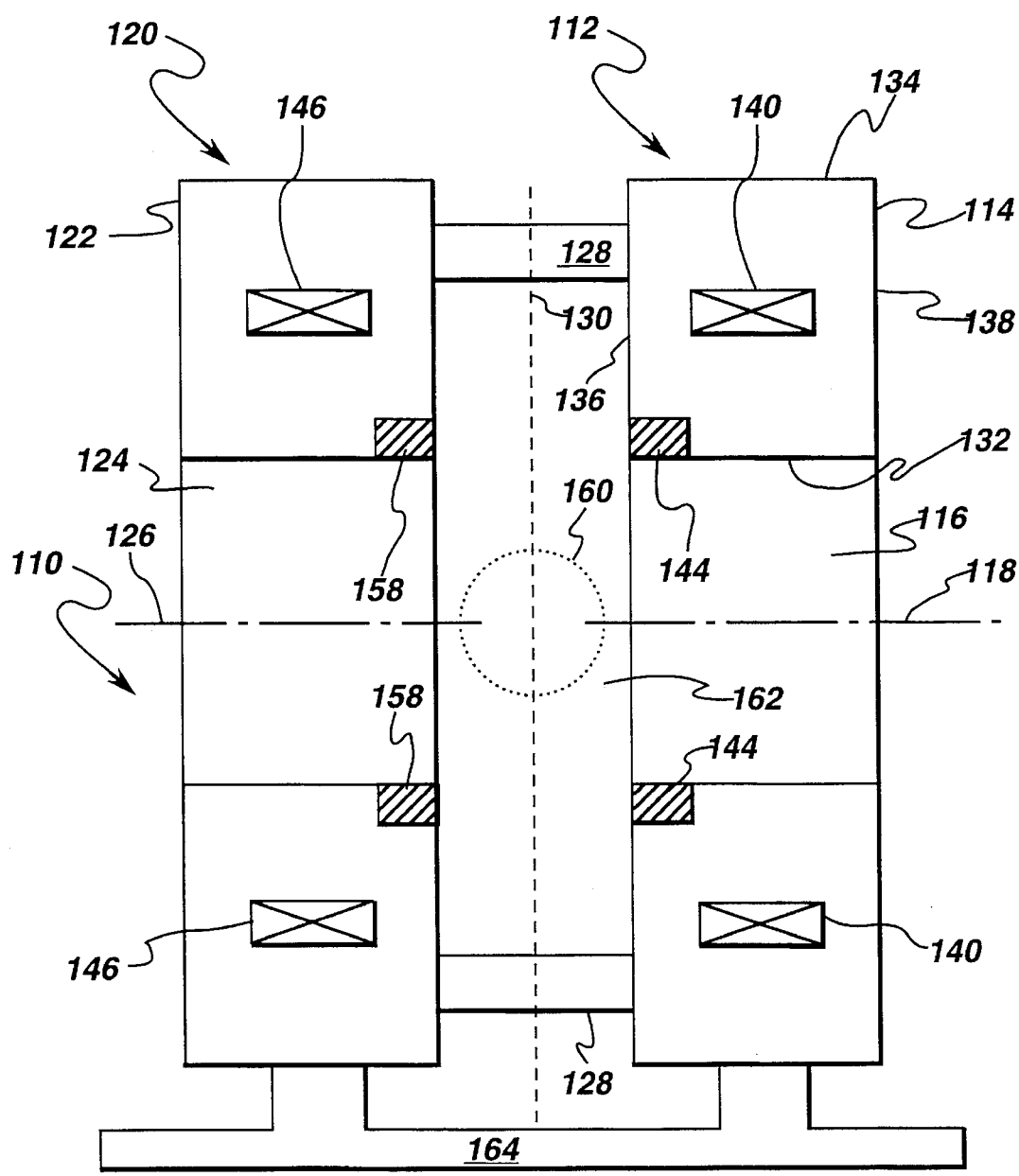
FIG. 2 is a schematic cross-sectional side-elevational view of the MRI magnet of FIG. 1 with a magnet floor mount added.

Referring now to the drawings, wherein like numerals represent like elements throughout, FIGS. 1–2 show a first preferred embodiment of the open magnetic resonance imaging (MRI) magnet 110 of the present invention. The magnet 110 includes a first superconductive coil assembly 112 with a generally toroidal-shaped first coil housing 114 which surrounds a first bore 116 and which has a generally longitudinal first axis 118. The magnet 110 also includes a second superconductive coil assembly 120 with a generally toroidal-shaped second coil housing 122 which surrounds a second bore 124 and which has a generally longitudinal second axis 126. The second coil housing 122 is longitudinally spaced apart from the first coil housing 114 by structural posts 128, and the second axis 126 is generally coaxially aligned with the first axis 118. Preferably, the second superconductive coil assembly 120 is a generally mirror image of the first superconductive coil assembly 112 about a plane 130 (seen on edge as a dashed line in FIG. 2) oriented perpendicular to the first axis 118 and disposed longitudinally midway between the first and second coil housings 114 and 122.

The first coil housing 114 includes a first generally-circumferential outside surface 132 facing generally towards the first axis 118 and a second generally-circumferential outside surface 134 radially spaced apart from the first circumferential outside surface 132 and facing generally away from the first axis 118. The first coil housing 114 also includes a first generally-annular outside surface 136 facing generally towards the plane 130 and a second generally-annular outside surface 138 longitudinally spaced apart from the first annular outside surface 136 and facing generally away from the plane 130.

The first superconductive coil assembly 112 also includes a generally annular-shaped first superconductive main coil 140 and preferably includes generally annular-shaped additional superconductive main coils (not shown in the figures). The additional superconductive main coils may be needed to achieve a high magnetic field strength, within the magnet's imaging volume, without exceeding the critical current density of the superconductor being used in the coils, as is known to those skilled in the art. The first superconductive main coil 140 is conventionally supported on a coil form (not shown in the figures). The first superconductive main coil 140 is generally coaxially aligned with the first axis 118, is disposed within the first coil housing 114, and carries a first main electric current in a first direction. The first direction is defined to be either a clockwise or a counterclockwise circumferential direction about the first axis 118 with any slight longitudinal component of current direction being ignored. Hence, the first superconductive main coil 140 has a first magnetic field direction within the first bore 116 which is generally parallel to the first axis 118. The first superconductive main coil 140 typically would be a superconductive wire or superconductive tape wound such that the first superconductive main coil 140 has a longitudinal extension and a radial extension (i.e., radial thickness) far greater than the corresponding dimensions of the superconductive wire or superconductive tape.

The magnet 110 additionally includes a generally annular-shaped first permanent magnet array 144 generally coaxially aligned with the first axis 118 and spaced radially inward and radially apart from the first superconductive main coil 140. The first permanent magnet array 144 may be an array of circumferentially-abutting permanent-magnet ring segments, or an array of spaced-apart, circumferentially-adjacent permanent-magnet ring segments wherein the length of the arc of any circumferential space between circumferentially-adjacent permanent-magnet ring segments is always smaller than the arc length of any permanent-magnet ring segment making up the array. In the first preferred embodiment, as shown in FIG. 2, the first permanent magnet array 144 is disposed within the first coil housing 114 proximate the first circumferential outside surface 132 and proximate the first annular outside surface 136. In an exemplary construction, the first permanent-magnet array 144 consists essentially of (and preferably consists of) a ferrite, samarium-cobalt, or neodymium-iron array.

As previously mentioned and as shown in FIGS. 1 and 2, the second superconductive coil assembly 120 is a generally mirror image of the first superconductive coil assembly 112 about the plane 130. Therefore, in addition to the second coil housing 122, the second superconductive coil assembly 120 also includes a generally annular-shaped second superconductive main coil 146 and preferably includes generally annular-shaped additional superconductive main coils. It is noted that the additional superconductive main coils would be needed by the second superconductive coil assembly 120 to balance any extra additional superconductive main coils of the first superconductive coil assembly 112, as can be appreciated by those skilled in the art. The second superconductive main coil 146 is conventionally supported on a coil form (not shown in the figures).

The second superconductive main coil 146 is generally coaxially aligned with the second axis 126, is disposed within the second coil housing 122, and carries a second main electric current in the first direction (i.e., in the same direction as the electric current in the first superconductive main coil 140). Hence, the second superconductive main coil 146 has a second magnetic field direction within the second bore 124 which is generally identical to the first magnetic field direction.

The magnet 110 further includes a generally annular-shaped second permanent magnet array 158 generally coaxially aligned with the second axis 126 and spaced radially inward and radially apart from the second superconductive main coil 146. The second permanent magnet array 158 may be an array of circumferentially-abutting permanent-magnet ring segments, or an array of spaced-apart, circumferentially-adjacent permanent-magnet ring segments wherein the length of the arc of any circumferential space between circumferentially-adjacent permanent-magnet ring segments is always smaller than the arc length of any permanent-magnet ring segment making up the array. In the first preferred embodiment, as shown in FIG. 2, the second permanent magnet array 158 is disposed within the second coil housing 122 proximate the circumferential outside surface which faces radially inward toward the second axis 126 and proximate the annular outside surface which faces longitudinally inward toward the plane 130. In an exemplary construction, the second permanent-magnet array 158 consists essentially of (and preferably consists of) a ferrite, samarium-cobalt, or neodymium-iron array. Preferably, the second permanent magnet array 158 is a generally mirror image of the first permanent magnet array 144 about the plane 130.

The superconductive main coils 140 and 146 of the magnet 110 typically produce a generally spherical imaging volume 160 (shown as a dotted circle in FIG. 2) centered generally at the intersection of the plane 130 and the first axis 118. The effect of the open space 162 between the two superconductive coil assemblies 112 and 120 is to distort the uniformity of the magnetic field of the spherical imaging volume 160. As one moves longitudinally through the spherical imaging volume 160, the magnitude of the magnetic field decreases with decreasing distance from the center of the spherical imaging volume 160 because of the missing superconductive main coils which were removed to create the open space 162. The effect of the permanent magnet arrays 144 and 158 is to lower the magnitude of the magnetic field toward the longitudinal edges of the spherical imaging volume 160 in line with the lower magnitude at the center. The permanent magnet arrays 144 and 158 are designed, using the principles of the present invention, previously disclosed herein, together with conventional magnetic field analysis, as is within the skill of the artisan, to produce a highly homogeneous magnetic field within the spherical imaging volume 160 for improved MRI imaging. In a preferred enablement, the first permanent magnet array 144 has a magnetic field direction within the first bore 116 generally opposite to the first magnetic field direction of the first superconductive main coil 140, and the second permanent magnet array 158 has a magnetic field direction within the second bore 124 generally opposite to the second magnetic field direction of the second superconductive main coil 146. It is noted that the magnet 110 is supported on a conventional magnet floor mount 164.

Figure 3:
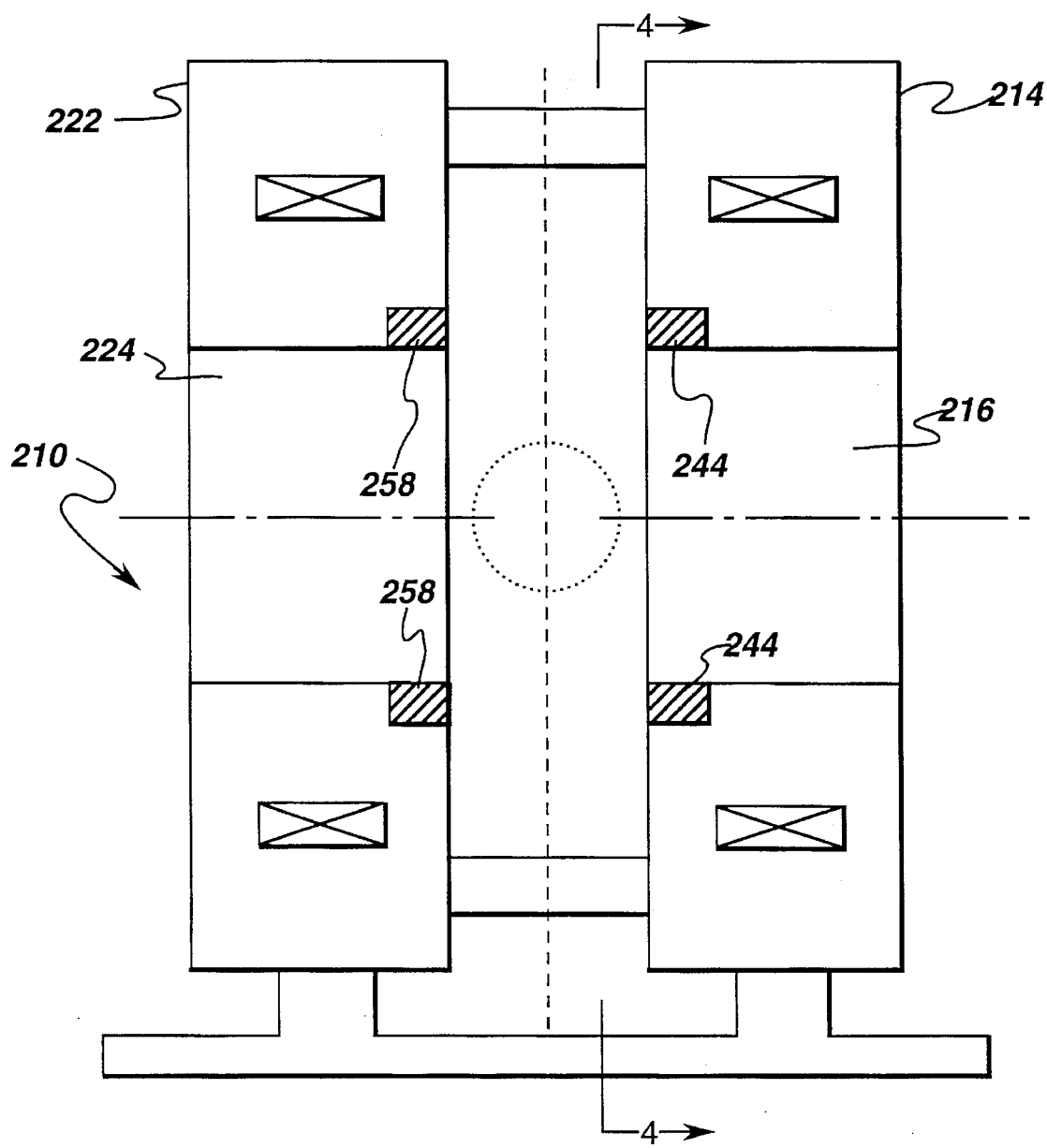
FIG. 3 is a view, as in FIG. 2, but of a second preferred embodiment of the open MRI magnet of the invention having external permanent magnet arrays.
Figure 4:
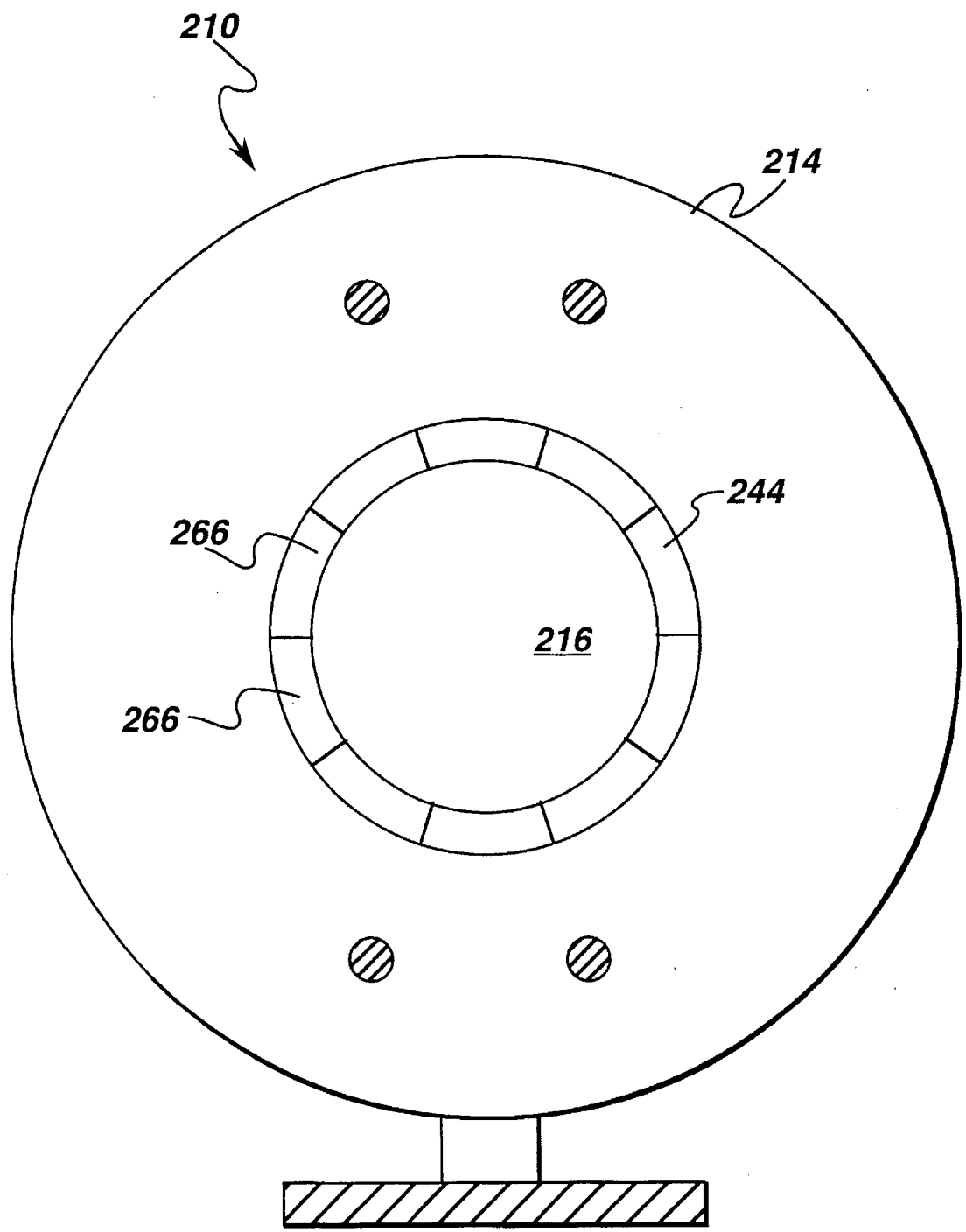
FIG. 4 is a schematic cross-sectional view of the MRI magnet of FIG. 3 taken along the lines 4—4 of FIG. 3.

Referring again to the drawings, FIGS. 3–4 show a second preferred embodiment of the open magnetic resonance imaging (MRI) magnet 210 of the present invention. Magnet 210 is identical to magnet 110 of the first preferred embodiment of the invention, with differences as hereinafter noted. The first permanent magnet array 244 is disposed outside (and not within) the first coil housing 214 in the first bore 216, and the second permanent magnet array 258 is disposed outside (and not within) the second coil housing 222 in the second bore 224. Preferably, as shown in FIG. 3, the first permanent magnet array 244 is attached to the first coil housing 214, and the second permanent magnet array 258 is attached to the second coil housing 222. It is noted, as shown in FIG. 4, that the first permanent magnet array 244 comprises an array of circumferentially-abutting permanent-magnet ring segments 266.

It is noted that magnet cooling mechanisms do not form a part of the present invention and have been omitted from the figures. Any cryogenic cooling mechanism, such as, but not limited to, liquid helium (or other cryogenic fluid) cooling and/or cryocooler cooling may be employed in combination with the present invention.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:
1. An open magnetic resonance imaging magnet comprising:
 a) a first superconductive coil assembly including:
  (1) a generally toroidal-shaped first coil housing surrounding a first bore and having a generally longitudinal first axis; and
  (2) a generally annular-shaped first superconductive main coil generally coaxially aligned with said first axis, disposed within said first coil housing, and having a first magnetic field direction within said first bore generally parallel to said first axis;
 b) a generally annular-shaped first permanent magnet array generally coaxially aligned with said first axis and spaced radially inward and radially apart from said first superconductive main coil;
 c) a second superconductive coil assembly including:
  (1) a generally toroidal-shaped second coil housing longitudinally spaced apart from said first coil housing, surrounding a second bore, and having a generally longitudinal second axis generally coaxially aligned with said first axis; and
  (2) a generally annular-shaped second superconductive main coil generally coaxially aligned with said second axis, disposed within said second coil housing, and having a second magnetic field direction within said second bore generally identical to said first magnetic field direction; and
 d) a generally annular-shaped second permanent magnet array generally coaxially aligned with said second axis and spaced radially inward and radially apart from said second superconductive main coil,
 wherein said second superconductive coil assembly is a generally mirror image of said first superconductive coil assembly about a plane oriented perpendicular to said first axis and disposed longitudinally midway between said first and second coil housings, and wherein said second permanent magnet array is a generally mirror image of said first permanent magnet array about said plane, and
 wherein said first permanent magnet array has a magnetic field direction within said first bore generally opposite to said first magnetic field direction and wherein said second permanent magnet array has a magnetic field direction within said second bore generally opposite to said second magnetic field direction.

2. The magnet of claim 1, wherein said first coil housing has a first generally-circumferential outside surface facing generally towards said first axis and wherein said first permanent magnet array is disposed proximate said first circumferential outside surface.

3. The magnet of claim 2, wherein said first coil housing has a first generally-annular outside surface facing generally towards said plane and wherein said first permanent magnet array is disposed proximate said first annular outside surface.

4. The magnet of claim 1, wherein said first coil housing has a first generally-annular outside surface facing generally towards said plane and wherein said first permanent magnet array is disposed proximate said first annular outside surface.

5. The magnet of claim 1, wherein said first permanent magnet array is disposed within said first coil housing and said second permanent magnet array is disposed within said second coil housing.

6. The magnet of claim 1, wherein said first permanent magnet array is disposed outside said first coil housing in said first bore and said second permanent magnet array is disposed outside said second coil housing in said second bore.

7. The magnet of claim 6, wherein said first permanent magnet array is attached to said first coil housing and said second permanent magnet array is attached to said second coil housing.

8. The magnet of claim 1, wherein said first permanent magnetic array is an array of circumferentially-abutting permanent-magnet ring segments.

* * * * *